United States Patent [19]
Woodward

[11] Patent Number: 5,959,479
[45] Date of Patent: Sep. 28, 1999

[54] SAMPLING TIMEBASE SYSTEM

[75] Inventor: Mark Joseph Woodward, Santa Rosa, Calif.

[73] Assignee: Hewlett-Packard Company, Palo Alto, Calif.

[21] Appl. No.: 08/927,972

[22] Filed: Sep. 11, 1997

[51] Int. Cl.[6] .............................. H03L 7/00; H03H 11/26
[52] U.S. Cl. ........................................... 327/160; 327/261
[58] Field of Search .................................. 327/91, 93, 94, 327/97, 141, 142, 151, 153, 160, 161, 162, 165, 265, 261, 286, 291; 377/15, 37, 52, 84; 341/122

[56] References Cited

U.S. PATENT DOCUMENTS

| 4,110,572 | 8/1978 | Cochrane | 179/175.3 R |
| 4,438,404 | 3/1984 | Philipp | 327/263 |
| 4,678,345 | 7/1987 | Agoston | 368/119 |
| 4,812,769 | 3/1989 | Agoston | 327/261 |
| 5,180,971 | 1/1993 | Montijo | 324/121 R |
| 5,315,627 | 5/1994 | Draving | 377/20 |
| 5,444,459 | 8/1995 | Moriyasu | 345/133 |

Primary Examiner—My-Trang Nu Ton
Attorney, Agent, or Firm—John L. Imperato

[57] ABSTRACT

A sampling timebase system uses the frequency stable clock signal present in digital systems to accurately reconstruct waveforms that are synchronous with the clock signal. The sampling timebase system provides a strobe signal having a precisely controlled time delay relative to a trigger event. An interval counter is programmed to count a specified number of the cycles of the clock signal, providing for coarse time delay adjustment of the strobe signal in time increments determined by the period of the clock signal. A fine delay generator triggered by the terminal count of the interval counter provides for fine adjustment of the time delay of the strobe signal. The interval counter and fine delay generator are programmable to progressively vary the time delay between the strobe signal and the trigger event relative to cycles of the waveform. The strobe signals, when applied to a sampler, enable sufficient samples to be acquired to reconstruct selected segments of the waveform. An optional prescaler included in the sampling timebase system divides the frequency of the applied clock signal when the clock signal is beyond the operating frequency of the interval counter or the fine delay generator.

10 Claims, 4 Drawing Sheets

SAMPLING TIMEBASE SYSTEM

BACKGROUND OF THE INVENTION

A variety of digital systems process pseudorandom bit sequences (PRBSs). In verifying the performance of these systems, it is often desirable to observe the waveform of the pseudorandom bit sequence at various locations within the system. Segments of the PRBS waveform can be reconstructed using sampled data acquisition systems, such as equivalent time sampling oscilloscopes.

Equivalent time sampling systems sample a waveform during repetitive cycles of the waveform. The timing of each new sample is progressively delayed relative to each of a succession of trigger events that are synchronous with the waveform. When a sufficient number of samples has been acquired, the sampled segment of the waveform is reconstructed and its characteristics are observed on a display or other output device. Equivalent time sampling systems described by Agoston in U.S. Pat. No. 4,812,769 and U.S. Pat. No. 4,678,345 incorporate oscillators to generate strobe signals that determine the timing of the waveform sampling. However, the oscillators add complexity to this type of sampling system.

Another known sampling system uses a startable oscillator that is started-up synchronous to a trigger event. Cycles of the oscillator's output signal are counted to generate strobe signals at predefined time delays relative to the trigger event. However, the frequency stability of the startable oscillator is compromised in order to achieve the quick start-up time, introducing uncertainty in the time delays. Frequency instability limits the accuracy of this type of sampling system, since the integrity of the waveform reconstruction depends on accurately controlling the time delay between the trigger event and the strobe signal.

Accordingly, there is a need for a sampling system that has low complexity and that accurately reconstructs repetitive waveforms, such as the waveforms of pseudorandom bit sequences or other digital signals present in digital systems.

SUMMARY OF THE INVENTION

According to the preferred embodiment of the present invention, a sampling timebase system has low complexity and uses a frequency stable clock signal present in digital systems to accurately reconstruct the waveforms of applied signals that are synchronous with the clock signal. The sampling timebase system provides a strobe signal that has a precisely controllable time delay relative to a trigger event. An interval counter is programmed to count a specified number of the cycles of the clock signal, providing for coarse time delay adjustment of the strobe signal. This coarse time delay is adjustable in time increments determined by the period of the clock signal. A fine delay generator triggered by the terminal count of the interval counter provides for fine adjustment of the time delay of the strobe signal. The interval counter and fine delay generator can be programmed to progressively vary the time delay between the strobe signal and the trigger event relative to each cycle of the waveform. The strobe signals, when applied to a sampler, enable sufficient samples to be acquired to reconstruct selected segments of the waveform. An optional prescaler included in the sampling timebase system divides the frequency of the clock signal when the clock signal is beyond the operating frequency of the interval counter or the fine delay generator.

DETAILED DESCRIPTION OF THE PREFERRED EMBODIMENT

Figure 1:
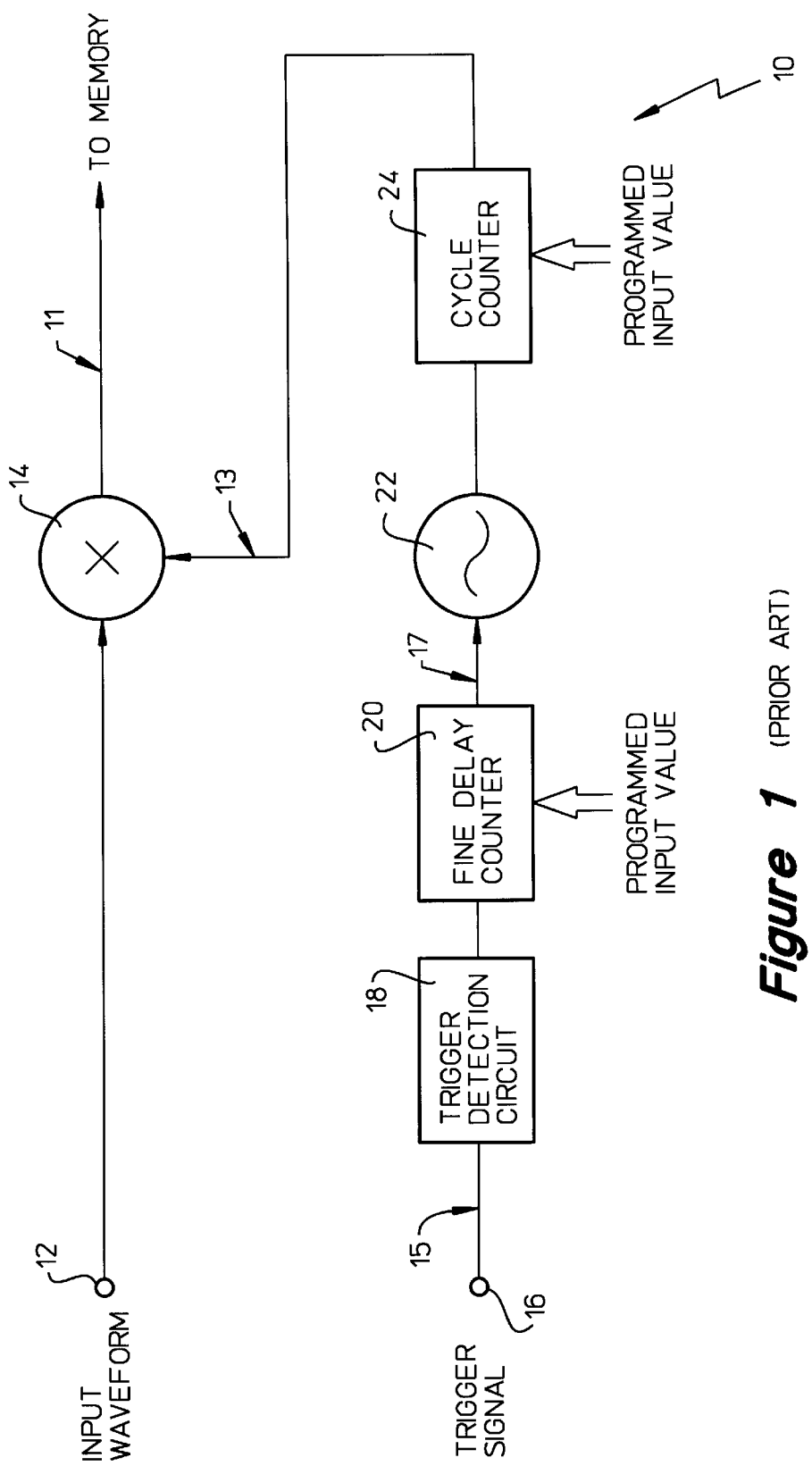
FIG. 1 shows a prior art sampling system.

FIG. 1 shows a prior art equivalent time sampling system 10. The input waveform to be sampled is applied to the input 12 of a sampler 14. The sampler 14 produces a digital value 11 representing the amplitude of the applied input waveform at various times, as determined by a strobe signal 13. Segments of the input waveform may be reconstructed from the digital values 11 and from the times, relative to a trigger signal 15, at which the digital values were acquired. The trigger signal 15 is applied to the input 16 of a trigger detection circuit 18. Once processed by the trigger detection circuit 18, the trigger signal 15 is applied to a fine delay counter 20. The fine delay counter 20 introduces a time delay according to a programmed input value to the fine delay counter. The terminal count 17 of the fine delay counter 20 starts the startable oscillator 22 so that the phase of the output signal of the startable oscillator 22 is synchronized to the terminal count 17. A cycle counter 24 counts the number of cycles of the output signal of the startable oscillator 22 to introduce an additional time delay, according to a second programmed input value applied to the cycle counter 24. A total time delay of $T = t1 + t2 + t_{misc}$ is introduced between the trigger signal 15 and the strobe signal 13, where t1 is the time delay introduced by the cycle counter 24, t2 is the time delay introduced by the fine delay counter 20 and $t_{misc}$ is the time delay introduced by the circuitry and signal propagation paths within the equivalent time sampling system 10.

The frequency stability of the startable oscillator 22 is compromised since the startable oscillator is designed to have a quick start-up time. Frequency stable oscillators that have high Qs generally have long start-up times. Short start-up time is achieved at the expense of frequency stability. Frequency instability in the startable oscillator 22 introduces variations and uncertainty in the time delay T between the trigger signal 15 and the strobe signal 13. This uncertainty in the time delay T limits the accuracy of the reconstruction of the input waveform provided by the equivalent time sampling system 10, since the waveform reconstruction depends on precise control of the time delay T.

Unfortunately, the uncertainty in the time delay T introduced by this type of equivalent time sampling system 10 even occurs in applications in which the applied trigger signal 15 has high stability. For example, although many types of digital systems, such as those that process pseudorandom bit sequences (PRBSs) or other digital signals, have highly stable data clocks available, errors in reconstruction of input waveforms still occur since the time delay in this type of sampling system 10 depends on counting cycles of the output signal of the unstable startable oscillator 22. Typically, the input waveforms of the digital signals within the digital systems are synchronous with the data clock.

Figure 2:
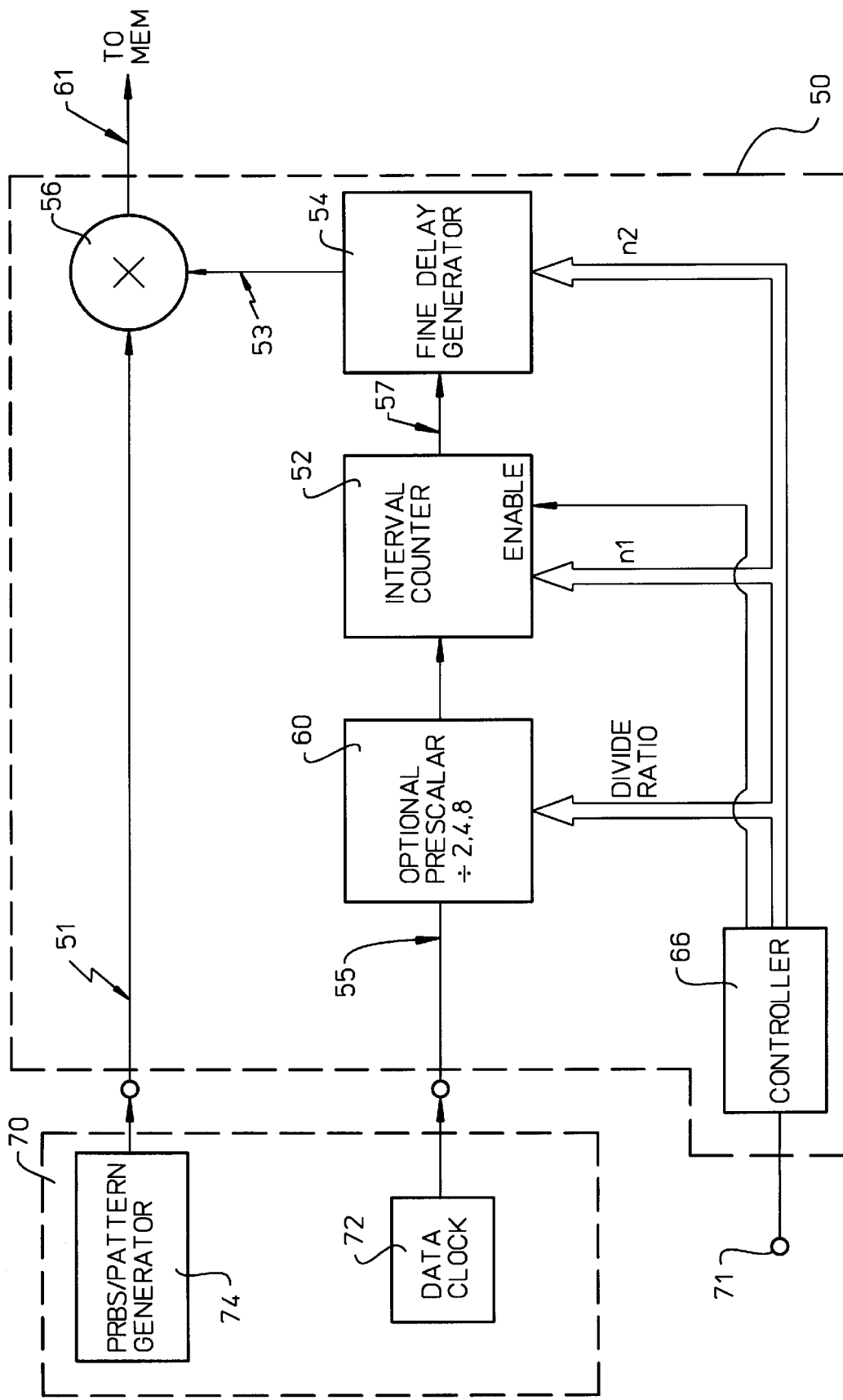
FIG. 2 shows a sampling timebase system constructed according to the preferred embodiment of the present invention.

FIG. 2 shows a sampling timebase system 50 constructed according to the preferred embodiment of the present invention. The sampling timebase system 50 takes advantage of the synchronous, highly-stable data clock 72 present in a variety of digital systems 70, by using the clock signal 55 from the data clock 72 as a timing reference. From the clock signal 55, a strobe signal 53 is generated that has a precisely controllable time delay relative to the clock signal 55. A sampler 56 receives the applied waveform 51 from the digital system 70. The waveform 51 may be a pseudorandom bit sequence (PRBS) or other type of signal. The sampler 56 also receives the strobe signal 53. The strobe signal 53 is generated by the sampling timebase system 50 and provides timing information to the sampler 56, which acquires a digital value 61 representing the amplitude of the applied waveform 51 at the sample time. The time delay of the strobe signal 53 relative to the clock signal 55 is progressively increased or decreased relative to cycles of the waveform 51, and when a sufficient number of adequately spaced samples have been acquired in a memory (not shown), the sampled segment of the waveform 51 is reconstructed and displayed on a CRT or other output device (not shown).

Figure 4:
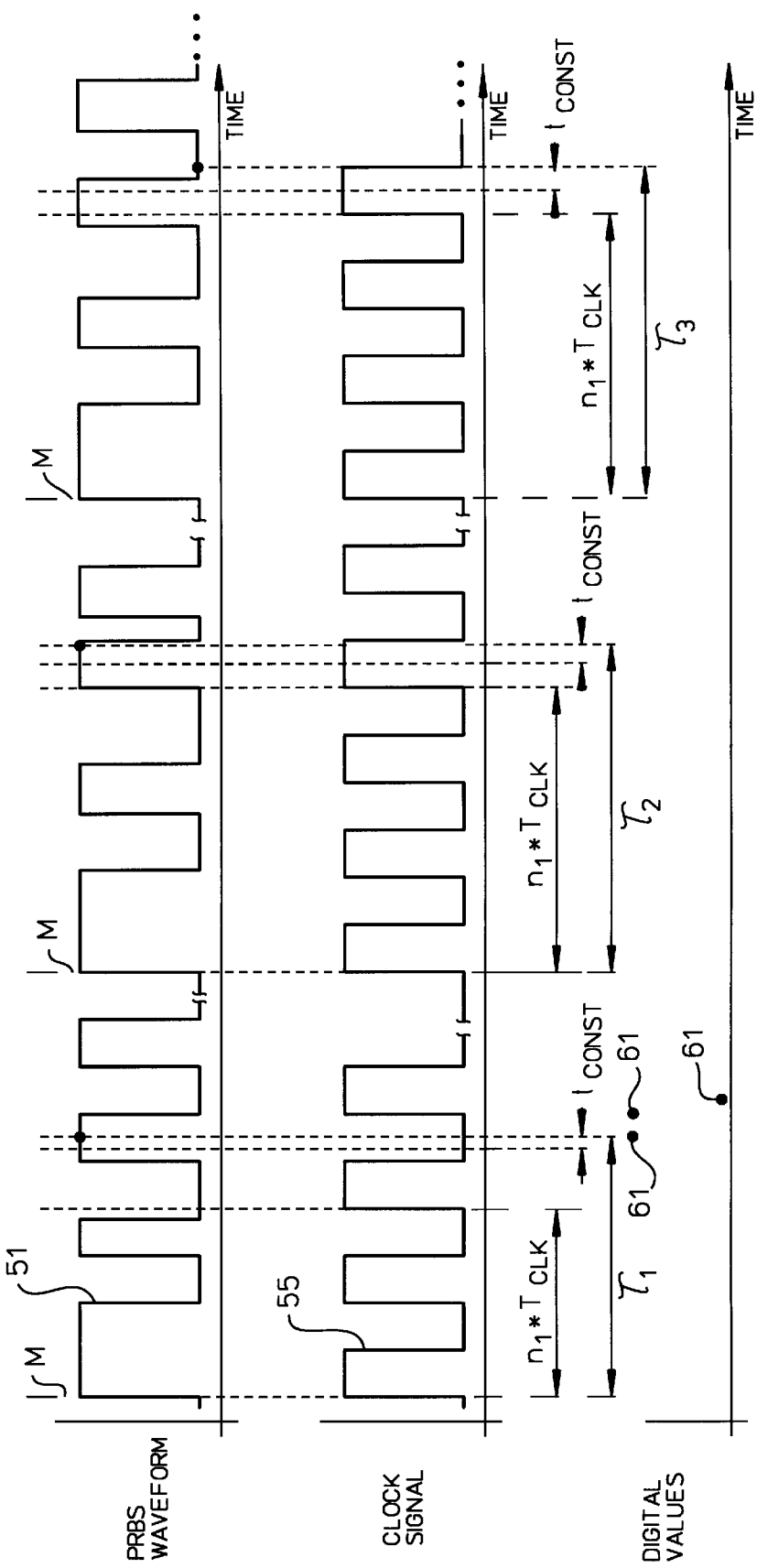
FIG. 4 shows a timing diagram of signals present in the sampling timebase system of FIG. 2.

In many digital systems 70 the waveform 51 of the digital signal is derived from the data clock 72 using a PRBS generator or a pattern generator 74 and the applied waveform 51 is therefore synchronous with the clock signal 55. FIG. 4 shows a timing diagram of the waveform 51 of a PRBS, including a pattern reference marker M, and the clock signal 55 applied to the sampling timebase system 50.

As shown in FIG. 2, an interval counter 52 is programmed by a controller 66, such as a microprocessor, or the interval counter receives information from a memory device or other source to count a predefined number of cycles of the clock signal 55. The interval counter 52 functions as a coarse delay generator and receives the clock signal 55 from the data clock 72. When the interval counter 52 is programmed to count n1 cycles, a terminal count 57 is produced having a time delay of n1*$T_{clk}$ seconds relative to the pattern reference marker M. $T_{clk}$ is the period of the clock signal 55. The pattern reference marker M is a predetermined cycle of the clock signal 55 which may also be designated as the trigger event for the sampling timebase system 50 by a user of the system via the external trigger input 71.

The interval counter 52 provides a time delay having a resolution, or step size, equal to a multiple of the period $T_{clk}$ of the clock signal 55. For example, when the clock signal 55 has a frequency of 250 MHz, the terminal count 57 of the interval counter 52 is delayed from the pattern reference marker M in 4 nanosecond (ns) increments.

Accurate reconstruction of a specified segment of the applied waveform 51 may warrant time delay resolution finer than the period $T_{clk}$ of the clock signal 55, as provided by the interval counter 52. A fine delay generator 54, triggered by the terminal count 57 of the interval counter 52 provides finer time delay resolution than that achieved by the interval counter 52. To achieve fine time delay resolution in the fine delay generator 54, the number of bits B of resolution of the fine delay generator 54 is divided over a period $T_{clk}$ of the clock signal 55, resulting in time delay resolution equal to $T_{clk}/2^B$. For example, a period $T_{clk}$ of a clock signal 55 equal to 4 ns and a 16 bit fine delay generator 54 yield a time delay resolution of 4 ns/$2^{16}$, which is less than 100 femtoseconds. Time periods other than $T_{clk}$ may also be used, but typically time periods greater than or equal to $T_{clk}$ are chosen to provide for continuous time delay adjustment of the strobe signal 53 relative to the trigger event.

The combination of the interval counter 52 and the fine delay generator 54 provides a time delay, or hold-off time for the strobe signal 53, relative to the trigger event (the pattern reference marker M), that derives its stability and accuracy from the clock signal 55. For example, a 32 bit interval counter 52 provides for hold-off times of up to $2^{32}*T_{clk}$, which for a clock signal period $T_{clk}$ of 4 ns is approximately 17 seconds. When long time delays are provided by the interval counter 52, small time delay increments are still obtainable by the fine delay generator 54.

Figure 3:
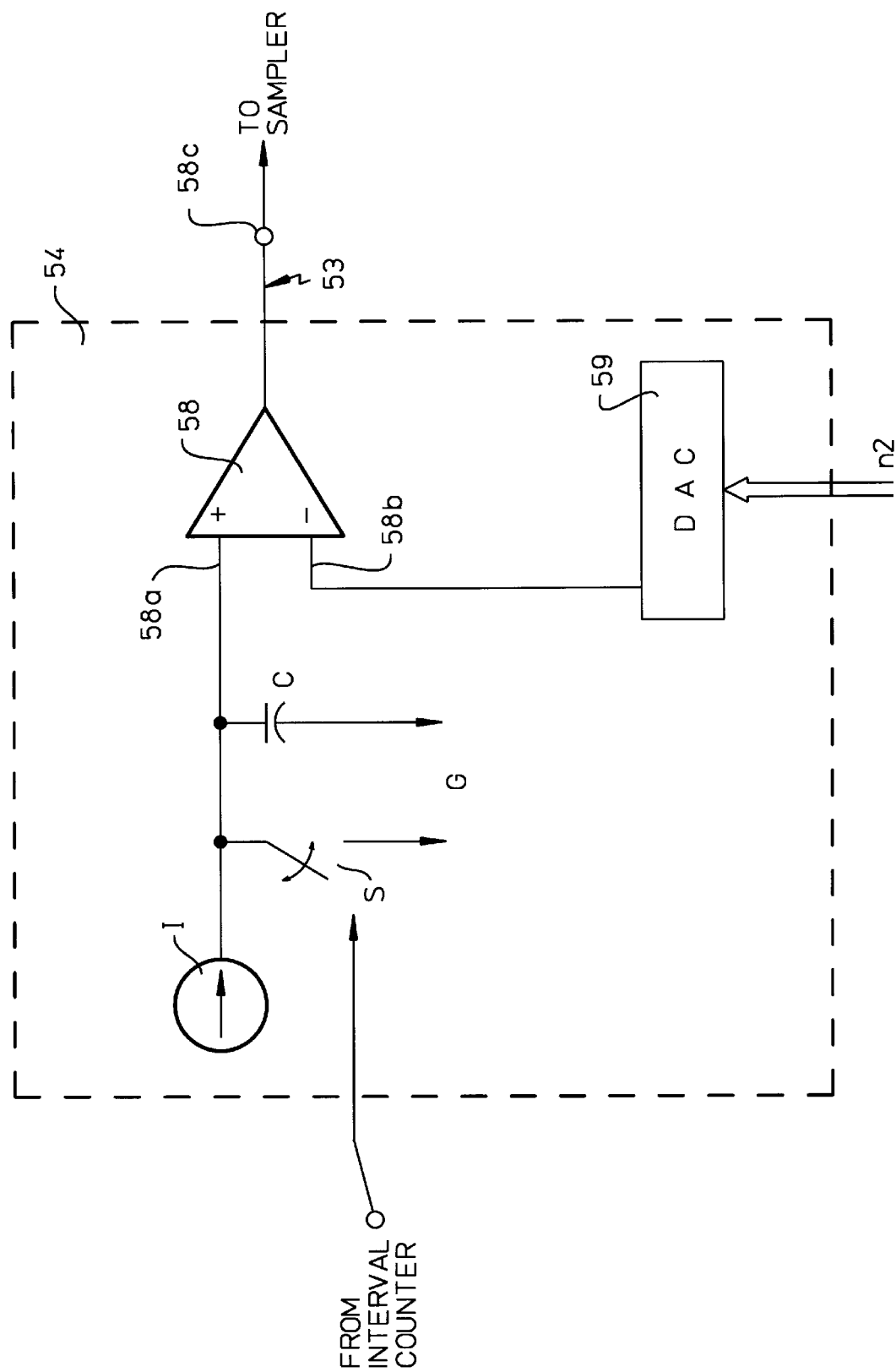
FIG. 3 shows a schematic of a fine delay generator included in the sampling timebase system of FIG. 2.

FIG. 3 shows a schematic of the fine delay generator 54 included in the sampling timebase system 50. A constant current source I supplies constant current to a capacitor C coupled between an input terminal 58a of a comparator 58 and a reference, such as ground G, creating a voltage ramp at the input terminal 58a. The voltage ramp varies linearly with time. The voltage ramp is reset by closing switch S and the ramp is triggered or restarted by opening switch S. Switch S is opened by the interval counter 52 when the terminal count 57 of the interval counter 52 is reached. A digital-to-analog converter (DAC) 59 is coupled to terminal 58b of comparator 58. The time delay between when switch S is closed and when the output 58c of comparator 58 transitions to the high state is determined by the programmed value n2 supplied to the DAC 59. The resolution of the DAC 59 determines the time delay resolution of the fine delay generator 54. Other types of programmable delay generators may also be used in the sampling timebase system 50, such as those implemented with analog circuitry, digital circuitry, delay lines or memory devices.

A user of the sampling timebase system 50 has the option of reconstructing selected segments of the waveform 51 of a PRBS that are positioned as many as several seconds from the pattern reference marker M, while maintaining sampling of the waveform 51 at the fine delay increments determined by the fine delay generator 54. The total time delay τ introduced by the interval counter 52 and the fine delay generator 54 is equal to n1*$T_{clk}$+n2*$T_{clk}/2^B$+$T_{const}$ where n1 is the value programmed to the interval counter 52 by the controller 66, where n2 is the value programmed to the fine delay generator 54 by the controller 66, and where $T_{const}$ is a time-invariant delay introduced by circuitry and signal propagation paths within the sampling timebase system 50. As cycles of the PRBS repeat, n1 and n2 are systematically adjusted, providing timing information to the sampler 56 so that a sufficient number of adequately spaced samples, or digital values 61, are acquired to reconstruct the selected segment of the waveform 51 of the PRBS. FIG. 4 shows three digital values 61 acquired at time delays $τ_1$, $τ_2$, and $τ_3$ relative to pattern reference markers M.

A user of the sampling timebase system 50 also has the option of specifying the pattern length, which is the number of bits between successive pattern reference markers M, of the applied digital signal or PRBS. Once the pattern length is specified, multiple segments of the waveform 51 of the PRBS can be sampled during each of the repetitive cycles of the PRBS by programming the interval counter 52 and the fine delay generator 54 appropriately. The total number of digital values 61 acquired may be limited by the available memory (not shown) to store the digital values 61 from the sampler 56, or limited by the speed at which the interval counter 52 and the fine delay generator 54 can be reset. The position of the pattern reference marker M within the digital signal or PRBS is also adjustable by a user of the sampling timebase system 50.

When the input waveform 51 is repetitive and a sufficient number of redundant digital values 61 have been acquired at corresponding segments of the waveform 51, averaging of the redundant digital values can be performed to improve the signal to noise ratio, thus improving the integrity of the reconstructed segment of waveform 51. When the input waveform 51 is non-repetitive, or when a single-valued reconstruction of a repetitive waveform 51 is not desired, acquisition of digital values representing cumulative segments of the waveform 51 may be obtained by the sampling timebase system 50. The cumulative segments may be used to construct an eye diagram of the input waveform 51, rather than a single-valued reconstruction of the waveform 51. When the available clock signal 55 is synchronous with the waveform 51, but is not periodic, eye diagrams of the input waveform 51 may also be constructed using the sampling timebase system 50.

The operating frequency of the sampling timebase system 50 is extended beyond the maximum operating frequency of the interval counter 52 and the fine delay generator 54 by including an optional prescalar 60 that receives the clock signal 55 and divides the frequency of the clock signal 55 before it is applied to the interval counter 52. The divide ratio of the prescalar 60 is selected according to the frequency of the clock signal 55 to bring the output of the prescalar 60 within the operating frequency of the interval counter 52 and the fine delay generator 54.

What is claimed is:

1. A timebase system for sampling a waveform synchronous with an applied clock signal comprising:
    a programmable counter receiving the clock signal and generating a terminal count when a programmed number of cycles of the clock signal have been counted, the counting initiated at the occurrence of a predefined one of the cycles;
    a programmable delay generator coupled to the programmable counter, receiving the terminal count and generating a strobe signal delayed from the terminal count according to a programmed delay value wherein the programmable delay generator includes a comparator, a capacitor coupled between a first terminal of the comparator and a reference, a digital to analog converter coupled to a second terminal of the comparator, a constant current source coupled to the first terminal of the comparator for supplying current to the capacitor, and a switch coupled in parallel to the capacitor, the switch coupled to the programmable counter and opened according to the terminal count of the programmable counter;
    a sampler coupled to an input of the timebase system receiving the waveform, and coupled to the programmable delay generator receiving the strobe signal, the sampler generating a digital value corresponding to the amplitude of the waveform at a time determined by the strobe signal; and
    a controller coupled to the programmable counter providing the programmed number, and coupled to the programmable delay generator providing the programmed delay value wherein at least one of the programmed number and the programmed delay value is varied relative to cycles of the waveform.

2. The timebase system of claim 1 wherein the waveform comprises a pseudorandom bit sequence and the predefined one of the cycles of the clock signal is a pattern reference marker within the pseudorandom bit sequence.

3. A timebase system generating a strobe signal for sampling a waveform synchronous with an applied clock signal, the timebase system comprising:
    a programmable counter receiving the clock signal and generating a terminal count when a programmed number of cycles of the clock signal have been counted, the counting initiated at the occurrence of a predefined one of the cycles, and
    a programmable delay generator coupled to the programmable counter, receiving the terminal count and generating the strobe signal delayed from the terminal count according to a programmed delay value, wherein the programmable delay generator includes a comparator, a capacitor coupled between a first terminal of the comparator and a reference, a digital to analog converter coupled to a second terminal of the comparator, a constant current source coupled to the first terminal of the comparator for supplying current to the capacitor, and a switch coupled in parallel to the capacitor, the switch coupled to the programmable counter and opened according to the terminal count of the programmable counter; and
    a controller coupled to the programmable counter providing the programmed number, and coupled to the programmable delay generator providing the programmed delay value wherein at least one of the programmed number and the programmed delay value is varied relative to the waveform.

4. The timebase system of claim 3 wherein the waveform comprises a pseudorandom bit sequence and the predefined one of the cycles of the clock signal is a pattern reference marker within the pseudorandom bit sequence.

5. A timebase system generating a strobe signal for sampling a waveform synchronous with an applied clock signal, the timebase system comprising;
    a prescalar receiving the clock signal and dividing the frequency of the clock signal by a predetermined divide ratio;
    a programmable counter coupled to the prescalar receiving the divided clock signal and generating a terminal count when a programmed number of cycles of the divided clock signal have been counted, the counting initiated at the occurrence of a predefined one of the cycles; and
    a programmable delay generator coupled to the programmable counter, receiving the terminal count and generating the strobe signal delayed from the terminal count according to a programmed delay value wherein the programmable delay generator includes a comparator, a capacitor coupled between a first terminal of the comparator and a reference, a digital to analog converter coupled to a second terminal of the comparator, a constant current source coupled to the first terminal of the comparator for supplying current to the capacitor, and a switch coupled in parallel to the capacitor, the switch coupled to the programmable counter and opened according to the terminal count of the programmable counter.

6. The timebase system of claim 5 further comprising a controller coupled to the programmable counter providing the programmed number, and coupled to the programmable delay generator providing the programmed delay value.

7. The timebase system of claim 6 wherein at least one of the programmed number and the programmed delay value is varied relative to cycles of the waveform.

8. The timebase system of claim 5 wherein the prescalar is coupled to the controller and the divide ratio is selected by the controller.

9. The timebase system of claim 5 further comprising a sampler coupled to an input of the timebase system receiving the waveform, and coupled to the programmable delay generator receiving the strobe signal, the sampler generating a digital value corresponding to the amplitude of the waveform at a time determined by the strobe signal.

10. The timebase system of claim 5 wherein the waveform comprises a pseudorandom bit sequence and the predefined cycle of the clock signal is a pattern reference marker within the pseudorandom bit sequence.

* * * * *